United States Patent [19]
Rein

[11] 3,962,628
[45] June 8, 1976

[54] ADJUSTABLE MAGNETIC GRADIOMETER

[75] Inventor: Charles R. Rein, Panama City, Fla.

[73] Assignee: The United States of America as represented by the Secretary of the Navy, Washington, D.C.

[22] Filed: Apr. 14, 1975

[21] Appl. No.: 568,074

[52] U.S. Cl. .............................. 324/43 G; 336/20; 336/DIG. 1
[51] Int. Cl.² ....................................... G01R 33/02
[58] Field of Search ................. 324/43 R, 43 G, 47; 336/20, DIG. 1

[56] References Cited
UNITED STATES PATENTS
3,142,796   7/1964   Goldberg et al. ................. 324/43 R

OTHER PUBLICATIONS

Zimmerman et al., Ultrasonic Superconducting Magnetic Gradiometer, NBS Report 10,736, Mar. 31, 1972, pp. 7–15.

Goodman et al., Superconducting Instrument Systems, Proc. of IEEE, vol. 61, No. 1, Jan. 1973, pp. 20–27.

Primary Examiner—Robert J. Corcoran
Attorney, Agent, or Firm—Richard S. Sciascia; Harvey A. David; Don D. Doty

[57] ABSTRACT

A cryogenic magnetic field gradiometer is described wherein adjustments of areas presented by a superconducting wire loop, that is confined in a support structure within a cryogenic environment, are adjusted mechanically through wire positioning elements operated by a plurality of parallel shafts extending to the exterior of the environment. In one embodiment the positioning elements are cams that cooperate to position portions of a wire loop, while in another form bell crank levers are used.

13 Claims, 7 Drawing Figures

ADJUSTABLE MAGNETIC GRADIOMETER

STATEMENT OF GOVERNMENT INTEREST

The invention described herein may be manufactured and used by or for the Government of the United States of America for Governmental purposes without the payment of any royalties thereon or therefor.

FIELD OF THE INVENTION

This invention relates to magnetic gradiometers and more particularly to the adjustment of loop areas in such devices suitable for use in the superconductive mode.

The cryogenic magnetic gradiometers required in submarine detection, mine hunting, mineral locating, and other systems generally comprise a plurality of spaced, superconductive metal loops the areas of which must differ by less than a very small amount, typically less than a millionth part of a single loop area. It has been found to be very difficult, if not impossible, to assemble gradiometer loops with such precision that adjustment after assembly is unnecessary. Adjustment is further complicated by the requirement that the loops be superconducting. In most practical applications this means that the loops must be immersed in liquid helium at about −450°F and be made of one of the few suitable superconducting materials. In addition, all construction materials must be non-ferrous or non-magnetic, in order that the instrument itself be free of magnetic gradients comparable to those it must detect.

DISCUSSION OF THE PRIOR ART

Previous gradiometers have been adjusted by removing metal from the loops, or by adding metal thereto. Those methods are unsatisfactory because the instrument must be removed from the liquid helium bath, a time consuming operation, and because the degree of adjustment is difficult to carry out with precision.

Other methods of adjustment utilize various means to effect distortions of the magnetic field, e.g. by positioning of a superconducting vane, positioning of magnetic slugs, and the like. Adjustment through the use of compensating or trimming coils or loops has also been contemplated. These methods suffer the disadvantages that the effects thereof may be dependent upon the direction of the earth's magnetic field and hence the use of such methods is handicapped if the instrument is to be mobile or portable.

Another important object of the invention is the provision of a magnetic field gradiometer wherein adjustment or calibration by altering loop areas as seen along any or all of three mutually orthogonal axes can be accomplished while the loop and its supporting structure is immersed in a cryogenic fluid medium.

As another object the invention aims to accomplish the foregoing through the provision of a plurality of selectively rotatable shafts, extending parallel to one another from the gradiometer cryogenic enclosure to the exterior thereof, and which shafts control loop distorting elements, such as cams or levers, to effect the desired changes in areas.

Other objects and many of the attendant advantages will be readily appreciated as the subject invention becomes better understood by reference to the following detailed description, when considered in conjunction with the accompanying drawings.

SUMMARY OF THE INVENTION

The present invention aims to overcome most, or all, of the disadvantages of the prior art with respect to adjustment of magnetic gradiometers, especially of the superconducting wire loop type, through the provision of apparatus for effecting controlled distortions of the wire loop or loops as necessary to equalize the respective areas thereof as seen in each of three mutually perpendicular areas, without removing the loop assembly from its cryogenic environment.

With the foregoing in mind, it is a principal object of the invention to provide an improved, cryogenic magnetic gradiometer capable of calibration with an ease and precision not available heretofore.

DESCRIPTION OF THE PREFERRED EMBODIMENT

Figure 1:
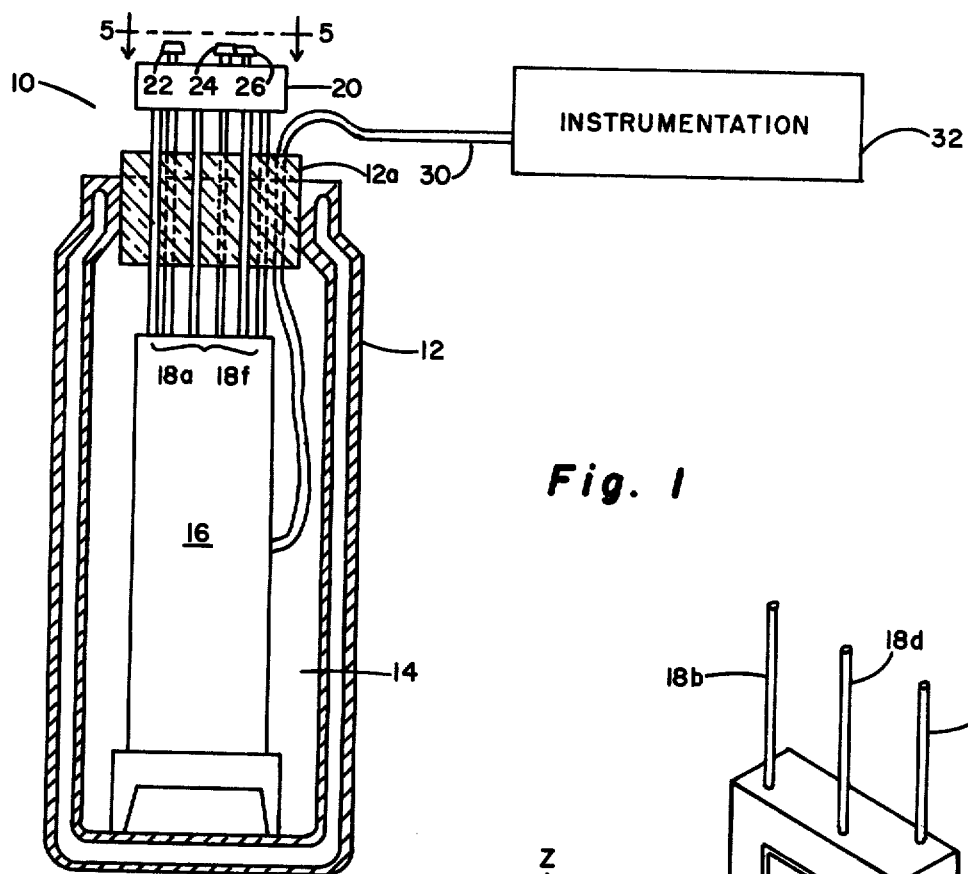
FIG. 1 is a sectional view of a cryogenic, magnetic field gradiometer embodying the invention.

In the exemplary form of the invention illustrated in FIG. 1 and described hereinafter, a cryogenic magnetic field gradiometer embodying the invention is indicated generally at 10 and comprises a cryogenic fluid containing housing 12, conveniently in the form of a Dewar flask. Disposed in housing 12, and immersed in a cryogenic fluid such as liquid helium 14, is a gradiometer loop support structure 16 from which extend a plurality of loop area adjusting shafts 18a, 18b, --- 18f. These shafts are preferably arranged parallel to one another for rotation about their respective axes, and extend through apertures in an insulating closure member 12a of housing 12 to the exterior of the cryogenic environment provided within that housing.

Shafts 18a–18f enter an adjustment control box 20, later described in more detail, which presents rotatable control knobs 22, 24, and 26. These knobs are used in making adjustments in the effective areas of a gradiometer loop with respect to X, Y, and Z axes in a manner which will be made apparent as this specification proceeds.

A cable 30 of electrical conductors leads from support structure 16, through the closure member 12a, and connects to appropriate instrumentation 32 for utilizing electrical signals that result from magnetic field conditions sensed by superconductive loops in support structure 16.

Figure 2:
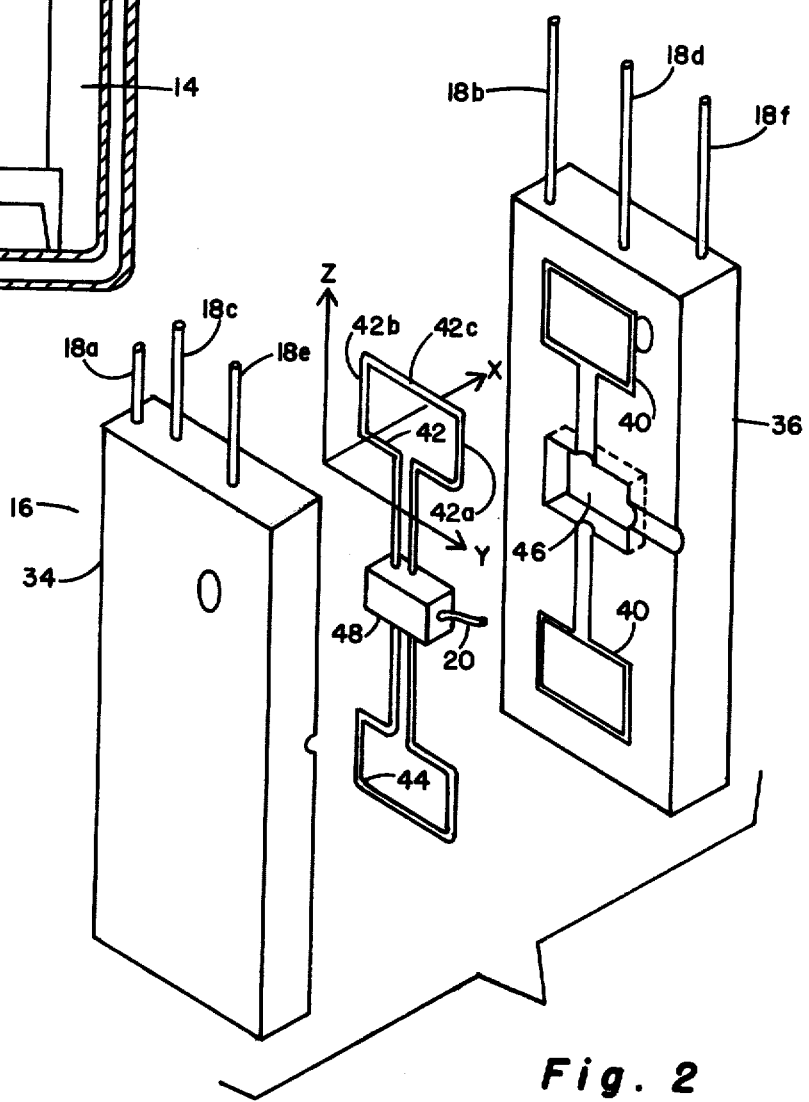
FIG. 2 is an exploded perspective view illustrating gradiometer loop, loop support structure, and loop adjusting means forming part of the gradiometer of FIG. 1.

Referring to FIG. 2, support structure 16, of the embodiment being described, comprises a pair of generally rectangular plates 34 and 36 which are adapted to be secured together in congruent relation along a common plane. Plates 34 and 36 are formed from a rigid, electrically insulating material, such as a fiber reenforced phenolic resin. These plates have defined, in the respective mating plane surfaces thereof, grooves 40 which cooperate in a complementary manner to form recesses in a pattern which will accommodate a pair of superconducting wire loops 42 and 44, only the grooves 40 in plate 36 being illustrated in FIG. 2. The wire loops are thereby closely confined against any flexing or distortion, with the exception of certain portions of the loops which pass through cavities and are purposely subject to controlled flexing or distortion to effect loop area adjustments.

An additional pair of recesses, one of which is seen at 46, are arranged to receive a Josephson or "weak" link connection device 48, interconnecting the loops, and from which cable 20 extends. The construction and function of such weak link connections are well known in the art to which the invention pertains and so will not be described further.

Loops 42 and 44 are formed from a suitable metal wire that exhibits superconducting capabilities at achievable low temperatures. Examples of such metal wire include those formed from lead, niobium, and various alloys of those and other metals.

When plates 34 and 36 are secured together in face to face relation with wire loops 42, 44 disposed in the grooves therein and link 48 in the recesses therefor, the loops are confined against any unintended movements. It will be noted, in the example being described, that loops 42 and 44 lie in a common vertical plane. It is generally the practice in the gradiometer art to designate gradiometers with respect to the axes X, Y, and Z of a Cartesian reference frame. The gradiometers are designated by two letters, such as XX, XY, YZ, etc. The first letter refers to the axis perpendicular to the plane or planes of the loops. The second letter refers to the axis parallel to a line joining the centers of the loops. For instance, an XZ gradiometer has loops in a plane perpendicular to the X direction and separated from one another in the Z direction. Their function is to measure the variation of the X component of a magnetic field in the Z direction. The embodiment 10 being described comprises an XZ gradiometer loop pair, although it will be understood that the invention applies as well to all other combinations.

Among other configurations with which the invention may be practiced are those wherein the loops lie parallel to one another and are separated along a common axis through their centers.

Now, in order for the gradiometer 10 to be characterized by its greatest degree of accuracy and sensitivity, it is necessary that the effective areas of loops 42 and 44, as seen in directions parallel to axis X normal to the common plane, be as nearly identical as is possible. Likewise, any areas presented by the two loops as viewed in directions parallel to the axis Y must also be as identical as possible, as must the areas presented when viewed in the direction of axis Z, the axes X, Y, and Z being mutually orthogonal.

Figure 3:
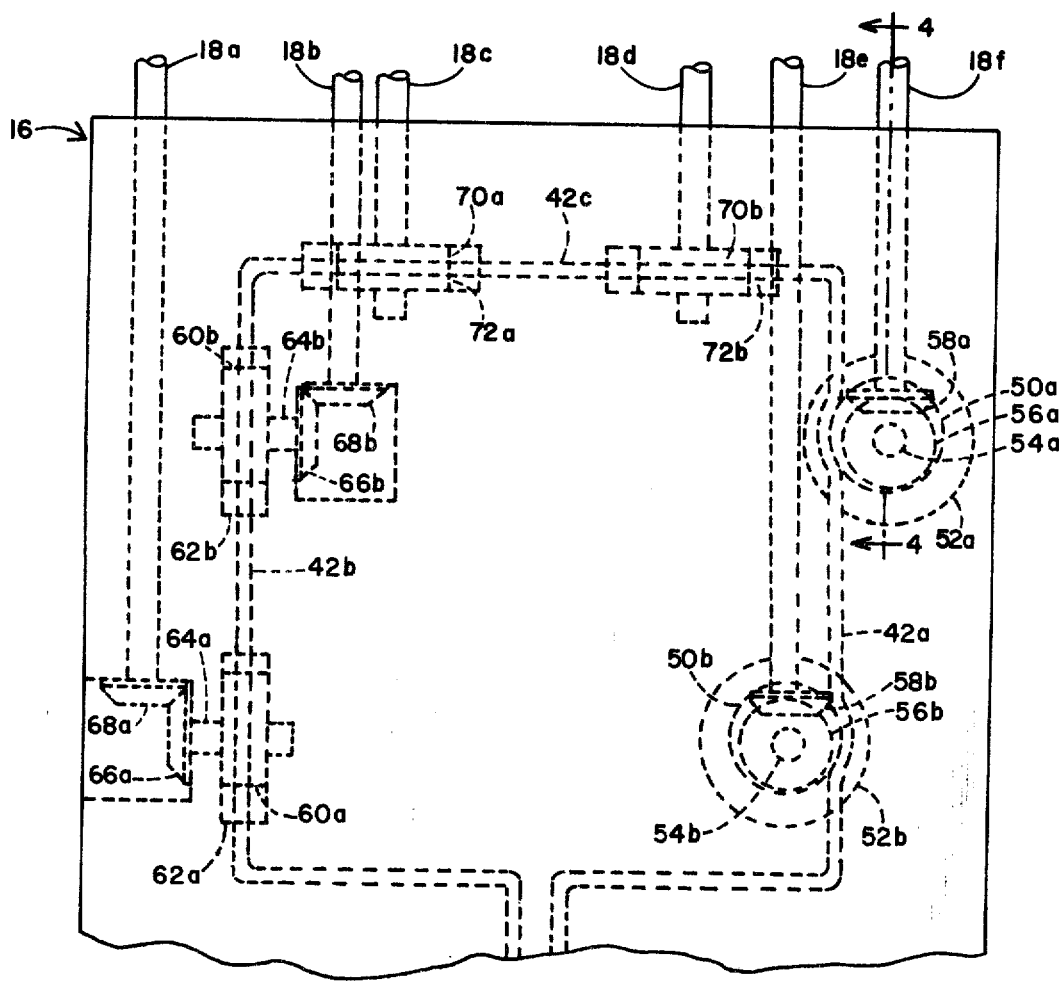
FIG. 3 is an enlarged, fragmentary elevational view of a portion of the loop support structure and adjusting means of the gradiometer.

To this end, the invention includes adjustment means for varying the areas presented by loop 42 relative to loop 44 by selective displacement or distortion of one or more of limbs or segments 42a, 42b, and 42c of loop 42. Referring to FIG. 3, a first pair of wire positioning elements, in the form of eccentrics or cams 50a, 50b, are disposed in cavities 52a, 52b defined in the support structure 16 by cooperating recesses formed in plates 34 and 36, the cam 50a and cavity 52a being best illustrated in FIG. 4. Cams 50a and 50b are mounted on stub shafts 54a, 54b, respectively, conveniently formed integrally with the respective cams of a suitable nonmagnetic material, such as "Nylon" plastic, that is rigid, self-lubricating, and moldable or mahineable to close tolerances.

Fixed to the shafts 54a, 54b, respectively are bevel gears 56a, 56b that cooperate with meshing bevel gears 58a, 58b on the inner ends of rotatable adjusting shafts 18f and 18e, respectively. Rotation of shaft 18f will, through the cooperation of level gears 58a, 56a, cause rotation of cam 50a in one direction or the other, depending upon the direction of rotation of the adjusting shaft. Cams 50a and 50b, and their respective cavities 52a, 52b, are located so that the cams are disposed on opposite sides of, and in contact with, portions of wire loop limb 42a that pass through the mentioned cavities. Rotation of the cams 50a, 50b serves to deflect or distort wire limb 42a in manner, later discussed in more detail, to obtain variation of area of loop 42 when viewed along the X axis.

A second set of cams 60a, 60b are mounted for rotation about parallel axes in cavities 62a, 62b formed between plates 34 and 36, and are provided with shafts 64a, 64b, respectively, on which are fixed level gears 66a and 66b. Cooperably meshed with gears 66a and 66b are level gears 68a and 68b that are fixed on the inner ends of rotatable adjusting shafts 18a and 18b. Cams 60a and 60b are disposed on opposite sides of, and in engagement with, portions of wire limb 42b passing through cavities 62a and 62b. Rotation of cams 60a and 60b is used to adjustably vary the effective area of loop 42 as viewed along the Y axis.

A third set of cams 70a, 70b are mounted for rotation about parallel axes in cavities 72a, 72b formed between plates 34 and 36. These cams are conveniently fixed directly on adjusting shafts 18c and 18d and are disposed on opposite sides of, and in engagement with, portions of wire limb 42c passing through cavities 72a and 72b. Rotation of cams 70a and 70b is used to adjustably vary the effective area of loop 42 as viewed along the Z axis.

Figures 4, 5:
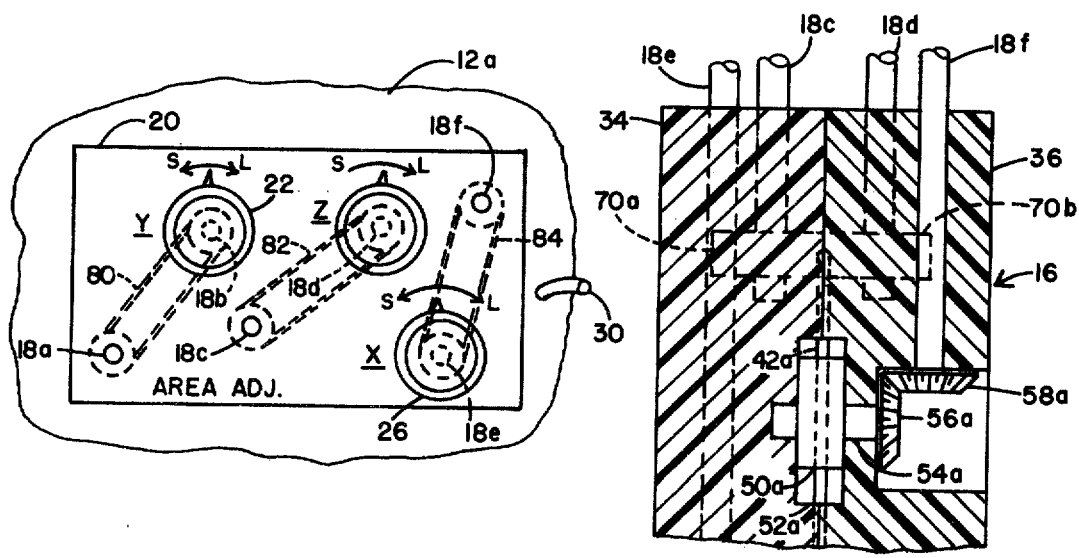
FIG. 4 is a sectional view taken substantially along line 4—4 of FIG. 3.
FIG. 5 is an enlarged, fragmentary plan view of a control portion of the gradiometer as viewed along line 5—5 of FIG. 1.

Referring now to FIG. 5, the upper end portions of adjustment shafts 18a---18f extend through, and are rotatably journalled in the spaced upper and lower walls of control box 20. Shafts 18b, 18d and 18e have knobs 22, 24, and 26 fixed directly thereon. Within box 20, shafts 18a and 18b are rotatably coupled to one another, as by sprockets and a chain 80, so that rotation of shaft 18b by knob 22 effects a simultaneous and equal rotation of shaft 18a. Similarly shafts 18c and 18d are coupled by sprockets and chain 82, while shafts 18e and 18f are coupled by sprockets and chain 84.

The upper surface of control box 20 is advantageously provided with indicia indicating the axes for which the respective knobs 22, 24, and 26 are effective to adjust area, together with indications of which direction to rotate the knobs to make the areas concerned smaller (S) or larger (L).

MODE OF OPERATION

Calibration of magnetic gradiometers is customarily carried out by taking readings in a variety of device positions, for example after each rotation of the device through 180° about successive ones of the X, Y, and Z axes, and making compensating adjustments until readings are equal or substantially equal for each of the positions. In the present invention, the making of the compensating adjustments is accomplished by flexing or distortion of portions of loop 42 through the agency of the described cams 50a, 50b, 60a, 60b, and 70a, 70b and their associated, manually controllable, drive means. Thus, with the device 10 in each of the mentioned positions, knobs 22, 24, and 26 can be readily maniuplated to cause the cams to change the area presented by loop 42 along the X, Y, and Z axes so as to eliminate, with great precision and convenience, the differences in magnetic field readings displayed or recorded by instrumentation means 32, and all without requiring removal of the support structure 16 and loops 42, 44 from their cyrogenic environment. The invention is, therefore, particularly well adapted to use in portable gradiometer systems.

Figures 6A, 6B, 6C:
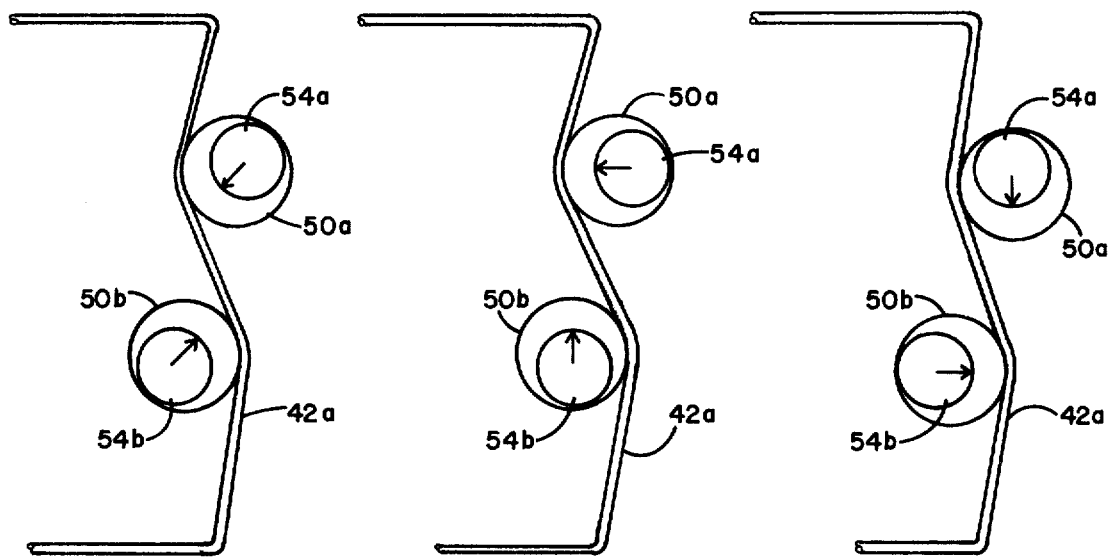
FIGS. 6a, 6b, and 6c are diagrammatic illustrations showing operation of loop adjusting cams in a variety of positions.

Referring to FIGS. 6a, 6b, and 6c there will be described the manner in which the X area, for example, of the loop 42 is adjusted by cooperation of the cams with a minimum of likelihood of exceeding the elastic limits of the wire, and while at the same time maintaining the wire limb 42a substantially confined against spurious movements resulting from jarring of from gravitational effects during changes of device position. Keeping in mind that the eccentricity of the cams and the sizes and spacings of parts with respect to one another are exaggerated for purposes of illustration, FIG. 6a shows cams 50a, 50b and limb 42a positioned in a configuration that may be regarded here providing as nominal loop area. Now, if knob 26 is rotated toward S, cam 50a will be rotated in a clockwise direction and cam 50b in a counter clockwise direction to positions illustrated in FIG. 6b.

The movement of cam 50b will permit the engaged portion of wire limb 42a to move in a direction decreasing loop area and also tending to decrease tension in the wire limb, i.e., produce slack therein. The movement of cam 50a will cause its engaged portion of the wire limb 42a to also move in a direction that will decrease loop area but will tend to increase tension in the wire limb, i.e., take up the slack provided by movement of cam 50b.

It will, therefore, be seen that cams 50a and 50b cooperate in a manner that will reduce the loop area with a minimal change in wire tension. If knob 26 were turned in the opposite direction from the nominal position toward L, cams 50a and 50b would be moved in opposite directions to positions such as are illustrated in FIG. 6c. In so doing cam 50a would allow the engaged portion of limb 42a to move outwardly of loop 42 while cam 50b would drive its engaged portion of limb 42a in the same direction, thereby increasing the area of the loop. Again, little change in wire tension would be experienced because of the cooperation of the cams. Accordingly, adjustments of area can be made in most instances without exceeding the elastic limits of the wire.

Cams 60a and 60b cooperate in the same fashion to effect changes in area relative to the Y axis, and cams 70a and 70b cooperate to effect changes in area relative to the Z axis. In the latter case, however, it should be noted that cams 70a and 70b, being mounted directly on shafts 18c and 18d, will rotate in the same directions when knob 24 is turned and accordingly the initial positioning of the cams relative to one another must take this into account. Of course, gear drives can be incorporated in the transmission of rotation to cams 70a and 70b to achieve counter rotation thereof, if desired. For example, sprocket and chain drive 82 can be replaced by a gear train including an idler gear between a gear on each of shafts 18c and 18d to achieve counter rotation of those shafts and their cams.

Figure 7:
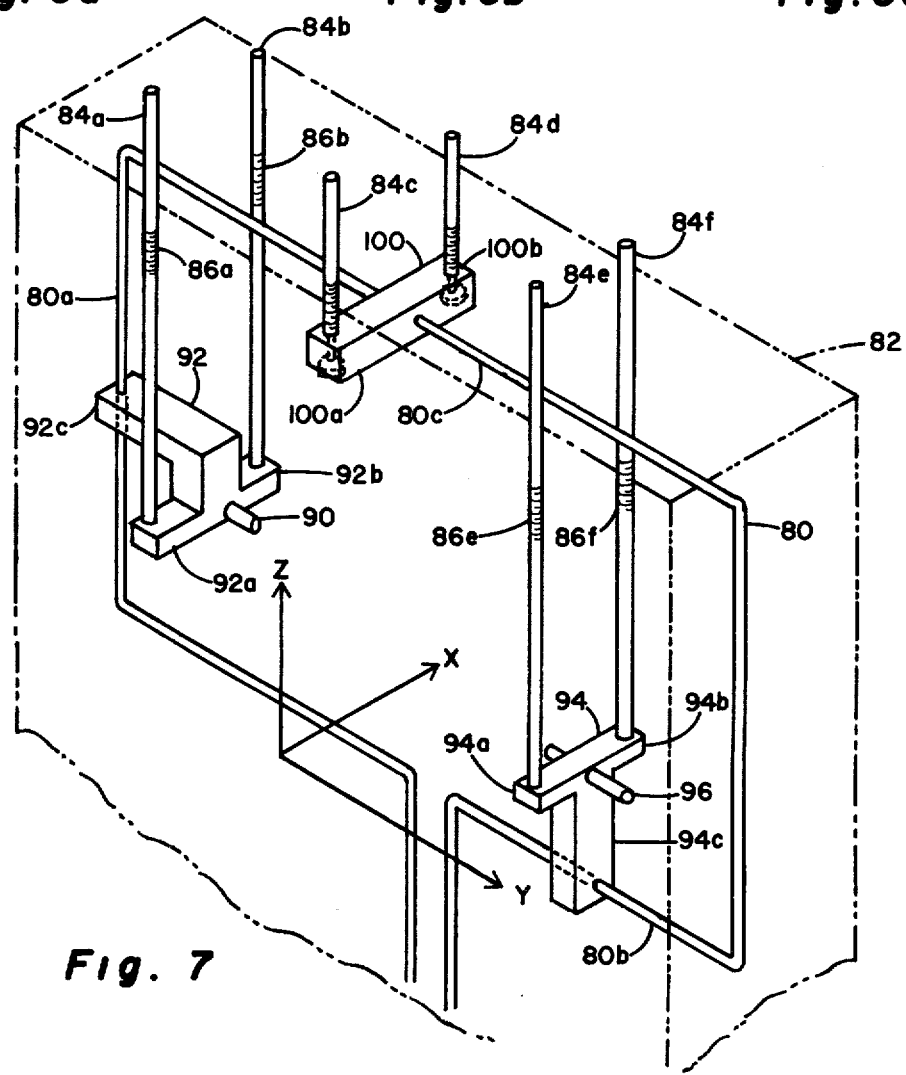
FIG. 7 is a perspective view, partly in phantom, illustrating an alternative embodiment of the invention.

Turning now to the embodiment of the invention illustrated in FIG. 7, a cryogenic magnetic gradiometer loop 80 is supported in a non-magnetic support structure 82, shown in phantom. Support structure 82 is conveniently similar to structure 16 in that it may comprise a pair of phenolic plates having grooves for holding the wire of loop 80 in its desired form. The limbs 80a, 80b and 80c of loop 80 may be positioned, to achieve increases or decreases of loop area in relation to X, Y and Z axes as in the prior embodiment, through rotation of adjustment shafts 84a --- 84f. These shafts may be coupled for rotation by three knobs as described with reference to shafts 18a --- 18f.

Shafts 84a, 84b are threadedly engaged, as shown at 86a, 86b, with structure 82 so that they move slightly along their respective long axes in response to rotation therearound. Mounted in structure 82, for pivotal movement about a shaft 90, is a bell crank lever 92 having arms 92a and 92b engaged by the ends of shafts 86a and 86b, respectively. A third arm 92c is provided with a slot or aperture in which is engaged loop limb 80a. Rotation of shafts 84a and 84b so as to cause one to move axially toward its associated bell crank arm and the other to move axially away from its associated bell crank arm, will cause the bell crank to be tilted about the axis of shaft 90. Such tilting will cause arm 92c to move limb 80a to adjust the area presented to the Y axis.

Similarly, shafts 84e and 84f are threadedly engaged at 86e and 86f with support structure 82, and have their inner ends engaged with arms 94a and 94b of a bell crank lever 94 that is pivoted to structure 82 by shaft 96 and has a third arm 94c engaging limb 80b of loop 80. Tilting of lever 94, by rotation and axial movements of shafts 84e and 84f will provide adjustment of loop area presented along axis Z.

Shafts 84c and 84d are also threadedly engaged in structure 82. These shafts have their inner ends connected to opposite ends 100a, 100b of a bar 100, through a central aperture of which extends loop limb 80c.

Simultaneous axial movements of shafts 84c and 84d inwardly of structure 82 cause bar 100 to translate inwardly of loop 80 and so to move limb 80c in a direction reducing the area presented to axis X. Of course, outward movement of shafts 84c, 84d, and bar 100 has the opposite effect.

Obviously, other embodiment and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A magnetic field gradiometer of the character described, comprising:
    first and second substantially planar wire loops, each of said loops being characterized by first, second, and third areas as viewed along first, second, and third mutually orthogonal axes;

support means, in supporting relation to said loops, for holding said loops in predetermined spaced relation to one another;

positioning means, mounted on said support means, for positioning at least one limb portion of one of said loops relative to the remainder of said one loop so as to alter one of said areas thereof;

instrument means, electrically coupled to said loops, for providing an output representative of relative effects of ambient magnetic field conditions on said loops; and said positioning means comprising at least one positioning element movably mounted on said support means and engaging said one limb portion, and shaft means, rotatably mounted with respect to said support means and coupled with said positioning element, for moving said positioning element and said one limb portion engaged thereby.

2. A magnetic field gradiometer as defined in claim 1, and wherein said positioning element comprises cam means, mounted for rotational movement on said support means.

3. A magnetic field gradiometer as defined in claim 1, and wherein said positioning element comprises a lever mounted for pivotal movement with respect to said support means.

4. A magnetic field gradiometer as defined in claim 1, and wherein said support means comprises:
first and second panels formed of a rigid, electrically insulating material, said panels having substantially congruent mating surfaces;
recesses defined in at least one of said surfaces in which wire of said first and second loops is confined; and
at least one cavity defined in said panels, through which cavity said one limb portion extends so as to be subject to positioning by said positioning element.

5. A magnetic field gradiometer as defined in claim 4, and wherein said positioning element comprises cam means, mounted for rotational movement on said support means and extending into said cavity.

6. A magnetic field gradiometer as defined in claim 4, and wherein said positioning element comprises a lever mounted for pivotal movement with respect to said support means.

7. In a magnetic field gradiometer including means for providing a cryogenic environment, superconductive adjustable coil means for sensing magnetic field strengths, and instrumentation means for providing output signals representative of sensed magnetic field strengths, said adjustable coil means comprising:
first and second substantially planar, superconductive wire loops, each of said loops being characterized by first, second, and third areas as viewed along first, second, and third mutually orthogonal axes;
support means, in supporting relation to said loops, for confining portions of said superconductive wire against movement while permitting movement of first, second, and third limb portions of said first loop; and
first, second, and third adjustable positioning means, mounted on said support means and extending to the exterior of said cryogenic environment, for positioning of said first, second, and third limb portions so as to selectively alter said first, second, and third areas of said first loop.

8. Adjustable coil means as defined in claim 7, and wherein said first, second, and third adjustable positioning means each comprises:
a pair of cams, mounted on said support structure for rotation about spaced, parallel axes, said cams being disposed on opposite sides of one of said limb portions;
a pair of shafts, rotatable about parallel axes and coupled to said cams to effect rotation thereof, said shafts extending to the exterior of said cryogenic environment; and
said cams being cooperable to position said one of said limb portions so as to alter one of said areas.

9. Adjustable coil means as defined in claim 8, and further comprising:
control means, connected to said shafts, for effecting simultaneous rotation of shaft pairs.

10. Adjustable coil means as defined in claim 7, and wherein said first, second, and third adjustable positioning means each comprises:
a lever, mounted for movement relative to said support structure, said lever having a portion engaging one of said limb portions; and
a pair of shafts, rotatable about parallel axes and coupled with said lever to effect movement thereof and of said one of said limb portions so as to alter one of said areas.

11. In a cryogenic magnetic gradiometer of the character described, the improvement comprising:
first and second substantially planar wire loops, each of said loops being characterized by first, second, and third areas as viewed in directions parallel to first, second, and third mutually orthogonal axes, respectively, said loops being formed of wire that exhibits a superconductive condition when subjected to a predetermined cryogenic environment;
support means, in supporting relation to said loops, for holding said loops in predetermined spaced relation to one another, said support means comprising a plurality of electrically insulating panels having loop confining recesses formed therein and further having a plurality of cavities defined therein through which pass first, second, and third limb portions of said first loop;
enclosures means, surrounding said support means and loops, for providing a cryogenic environment for said loops;
first, second, and third pairs of cams rotatably mounted in said cavities in said support means;
said first limb portion passing between the cams of said first pair of cams, said second limb portion passing between the cams of said second pair of cams, and said third limb portion passing between said third pair of cams;
first, second, and third shaft means coupled to said first, second, and third pairs of cams, respectively, said shaft means extending to the exterior of said enclosure means and operable to effect selective rotation of said pairs of cams so as to selectively position said first, second, and third limb portions to selectively alter said first, second, and third areas; and
said limb portions each being engaged at spaced zones therealong and being held in a non-linear configuration by the pair of cams associated therewith so that rotation of one cam of a pair increases slack in the associated wire limb whereas rotation of the other cam of that pair decreases slack in the associated wire limb.

12. In a cryogenic magnetic gradiometer of the character described, the improvement as defined in claim 11, and further comprising:
   rotatable control means, connected to said shaft means externally of said enclosure, for selectively effecting simultaneous rotation of the cams of said first pair of cams, of the cams of said second pair of cams, and the cams of said third pair of cams.

13. In a cryogenic magnetic gradiometer of the character described, the improvement as defined in claim 12, and wherein:
   said first, second, and third shaft means comprise first, second, and third pairs of parallel shafts;
   said first pair of cams being coupled to said first pair of shafts by bevel gear means;
   said second pair of cams being coupled to said second pair of shafts by bevel gear means; and
   said third pair of cams being connected directly to said third pair of shafts.

* * * * *